United States Patent [19]

Zeber

[11] Patent Number: 5,703,405

[45] Date of Patent: Dec. 30, 1997

[54] INTEGRATED CIRCUIT CHIP FORMED FROM PROCESSING TWO OPPOSING SURFACES OF A WAFER

[75] Inventor: Kenneth Arthur Zeber, Oakland Park, Fla.

[73] Assignee: Motorola, Inc., Schaumburg, Ill.

[21] Appl. No.: 591,194

[22] Filed: Jan. 16, 1996

Related U.S. Application Data

[63] Continuation of Ser. No. 345,975, Nov. 25, 1994, abandoned, which is a continuation of Ser. No. 31,453, Mar. 15, 1993, abandoned.

[51] Int. Cl.$^6$ .................... H01L 23/48; H01L 23/52
[52] U.S. Cl. .................... 257/777; 257/690; 257/723; 257/774; 257/778
[58] Field of Search ............... 257/777, 688, 257/678, 679, 723, 690, 778, 686, 774

[56] References Cited

U.S. PATENT DOCUMENTS

| 3,787,252 | 1/1974 | Filippazzi et al. | 148/175 |
|---|---|---|---|
| 4,074,342 | 2/1978 | Honn et al. | 361/411 |
| 4,578,739 | 3/1986 | McKee et al. | 361/395 |
| 4,700,276 | 10/1987 | Freyman et al. | 361/403 |
| 4,700,473 | 10/1987 | Freyman et al. | 29/846 |
| 4,721,995 | 1/1988 | Tanizawa | 257/777 |
| 4,792,532 | 12/1988 | Ohtani et al. | 437/206 |
| 4,819,041 | 4/1989 | Redmond | 257/712 |
| 4,939,568 | 7/1990 | Kato et al. | 257/777 |

FOREIGN PATENT DOCUMENTS

| 56-148857 | 11/1981 | Japan | 257/777 |
|---|---|---|---|
| 58-218130 | 12/1983 | Japan | 257/777 |
| 54-172748 | 9/1984 | Japan | 257/774 |
| 59-229850 | 12/1984 | Japan | 257/777 |
| 60-079763 | 5/1985 | Japan | 257/686 |
| 182731 | 9/1985 | Japan | H01L 21/60 |
| 101067 | 5/1986 | Japan | H01L 25/04 |
| 207037 | 9/1986 | Japan | H01L 23/28 |
| 3-255657 | 11/1991 | Japan | 257/778 |
| 4-062866 | 2/1992 | Japan | 257/686 |
| 4-116965 | 4/1992 | Japan | 257/777 |
| 2046514 | 11/1980 | United Kingdom | 257/774 |

OTHER PUBLICATIONS

Solder Bonding of Silicon Chips with Through Holes, Kuhn et al., IBM TDB vol. 18, No. 10, 3176, p. 3478.

"Basic Integrated Circuitry", pp. 1–30, by Hamilton and Howard, published by McGraw–Hill, Inc., 1975.

*Primary Examiner*—Tom Thomas
*Assistant Examiner*—David Ostrowski
*Attorney, Agent, or Firm*—Kelly A. Gardner; Philip P. Macnak

[57] ABSTRACT

An integrated circuit chip (100) includes an integrated circuit die (105) having first and second opposing surfaces (110, 115). A first integrated circuit (205) is formed on the first surface (110), and has a first plurality of terminals (200) coupled thereto for connection to first circuitry external to the integrated circuit chip (100), wherein the first plurality of terminals (200) is formed on the first surface (110). A second integrated circuit (300) is formed on the second surface (115), is electrically isolated from the first integrated circuit (205), and has a second plurality of terminals (305) coupled thereto for connection to second circuitry external to the integrated circuit chip (100). The second plurality of terminals (305) is formed on the first surface (110) and is coupled to the second integrated circuit (300) via plated holes formed through the integrated circuit die (105). The second plurality of terminals (300) is electrically isolated from the first plurality of terminals (200) and the first integrated circuit (205).

9 Claims, 4 Drawing Sheets

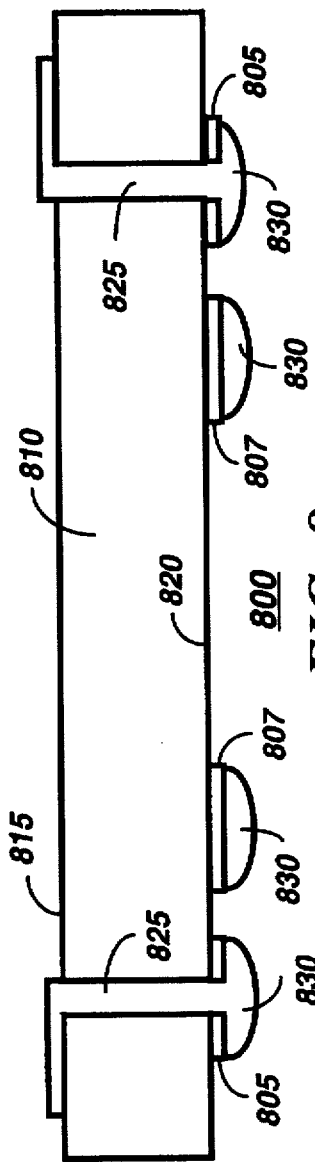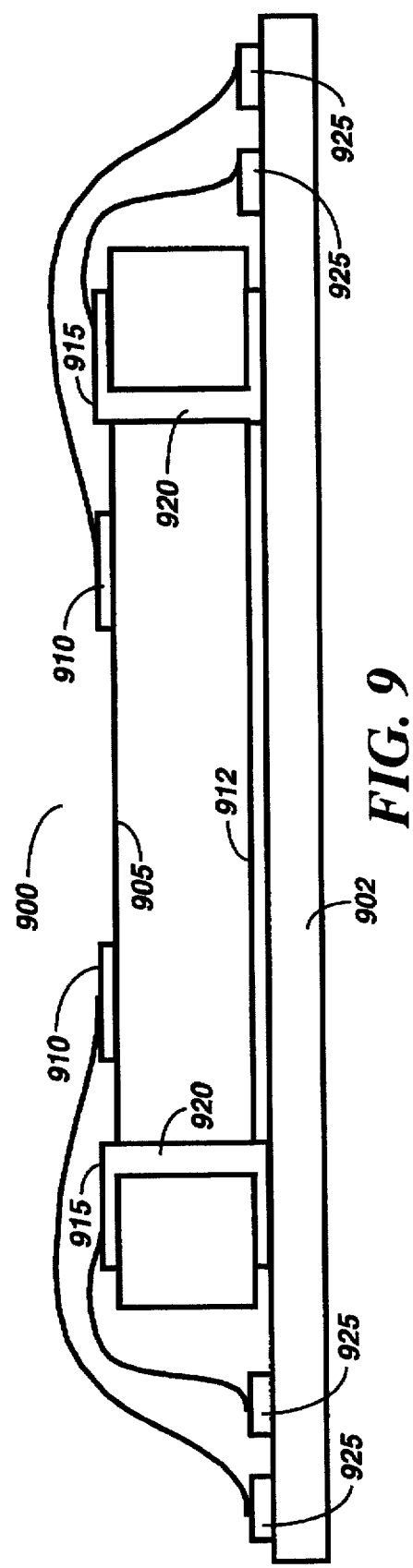

INTEGRATED CIRCUIT CHIP FORMED FROM PROCESSING TWO OPPOSING SURFACES OF A WAFER

This is a continuation of application Ser. No. 08/345,975, filed Nov. 25, 1994 and now abandoned which is a continuation of application Ser. No. 08/031,453, filed Mar. 15, 1993, now abandoned.

FIELD OF THE INVENTION

This invention relates in general to integrated circuit technology, and more specifically to integrated circuit chips formed from wafers.

BACKGROUND OF THE INVENTION

Modern selective call receivers, e.g., pagers, generally include printed circuit boards having electrical components mounted thereon and interconnected thereby. Because pagers are intended for portable use and are usually carried by a user, smaller, less cumbersome pagers are considered very desirable. Additionally, smaller pagers are desirable because they are typically less noticeable, and thus more attractive, than large, bulky pagers. As market trends dictate the design and manufacture of smaller pagers, techniques must be devised to efficiently utilize the area on the printed circuit board. It will be appreciated that such techniques are also desirable for use in other electronic devices wherein space is of consideration.

The use of integrated circuit chips is one method by which area on the printed circuit board can be more efficiently utilized. Integrated circuit chips are generally formed by growing a layer of silicon dioxide ($SiO_2$) on the surface of a polished silicon wafer, which is typically doped with a p-type impurity such as boron. Photolithographic techniques are thereafter employed to remove the oxide in selected regions where circuit elements such as transistors will be placed. In these regions, impurities are deposited on the surface of the wafer to form an n-type highly conductive layer, referred to as a buried layer. Subsequently, an epitaxial layer of silicon atoms is deposited on the wafer by exposing the wafer to a high temperature silicon compound atmosphere. For formation of a transistor, successive oxide growths, photolithography steps, and diffusions are carried out to put isolation walls and base and emitter impurity distributions in place on the wafer. In similar manner, integrated circuit elements such as resistors, capacitors, and diodes are formed on the wafer, after which metallization is selectively applied to provide circuit interconnections and to provide terminals by which the integrated circuitry can be electrically coupled to other external electrical components. The wafer is then cut into individual integrated circuit chips.

One conventional method by which terminals of an integrated circuit chip are electrically coupled to a printed circuit board is referred to as wirebonding. In a wirebonded integrated circuit chip, the integrated circuitry and the terminals therefor are formed on a first surface of the wafer. The integrated circuit chip is placed on a printed circuit board or other circuit carrying substrate such that the integrated circuitry and the terminals are facing upwards, i.e., away from the printed circuit board, and the terminals are connected to corresponding pads on the printed circuit board by an array of wires. The wires are connected utilizing well known wire bonding or tape automated bonding techniques.

Another conventional type of integrated circuit chip is referred to as a "flip chip". During manufacture of a flip chip, the integrated circuitry which is formed on the first side of the wafer is electrically coupled to an array of terminals formed on the second side of the wafer. The array of terminals is then bumped with solder. The bumped flip chip is thereafter placed on a printed circuit board such that the terminals contact corresponding pads on the printed circuit board. The flip chip, which is surface mountable, can then be processed using conventional reflow technology to couple the flip chip to the printed circuit board.

To further reduce the space consumed by circuitry on the printed circuit board, stacked integrated circuit chip arrangements are typically utilized. In such arrangements, two or more integrated circuit chips are stacked on top of each other and coupled to the printed circuit board in a variety of ways. By way of example, one well known memory module comprises a plurality of integrated circuit chips, each of which is wirebonded to a corresponding circuit carrier to form a circuit carrier system. The plurality of circuit carrier systems are then stacked one on top of the other and interconnects via external electrodes formed on the circuit carriers. In a different type of arrangement, an integrated circuit package is formed by stacking a wirebonded integrated circuit chip on top of a flip chip. The integrated circuit package is placed on a printed circuit board such that the solder bumped terminals of the flip chip contact pads of the printed circuit board and the terminals of the wirebonded integrated circuit chip are facing away from the printed circuit board. The integrated circuit package is reflowed to couple the solder bumped terminals to the printed circuit board, subsequent to which the upwardly-facing terminals are wirebonded to the printed circuit board. In many cases, a dummy substrate is stacked between the wirebonded integrated circuit chip and the flip chip to reduce stress on the package.

Although integrated circuit packages formed from such stacking arrangements more efficiently utilize the area of a printed circuit board, the integrated circuit packages are typically greater in height than conventional flip chips or wirebonded integrated circuit chips. This is very undesirable for use in smaller electronic devices, especially credit-card type paging receivers, which are substantially thinner and more streamlined than other conventional devices.

Thus, what is needed is an improved integrated circuit package which efficiently utilizes the area of a printed circuit board. Additionally, the integrated circuit package should not be greater in height than conventional integrated circuit chips.

SUMMARY OF THE INVENTION

In accordance with a first aspect of the present invention an integrated circuit chip comprises an integrated circuit die having first and second opposing surfaces. A first integrated circuit is formed on the first surface, the first integrated circuit having a first plurality of terminals coupled thereto for connection to first circuitry external to the integrated circuit chip, wherein the first plurality of terminals is formed on the first surface. A second integrated circuit is formed on the second surface, the second integrated circuit being electrically isolated from the first integrated circuit, and having a second plurality of terminals coupled thereto for connection to second circuitry external to the integrated circuit chip, wherein the second plurality of terminals is formed on the first surface and coupled to the second integrated circuit via plated holes formed through the integrated circuit die, wherein the second plurality of terminals is electrically isolated from the first plurality of terminals and the first integrated circuit.

In accordance with a second aspect of the present invention an electronic assembly comprises a circuit carrying substrate having first and second pluralities of contacts formed thereon, and an integrated circuit chip mounted on the circuit carrying substrate. The integrated circuit chip comprises an integrated circuit die having first and second opposing surfaces. A first integrated circuit is formed on the first surface, the first integrated circuit having a first plurality of terminals coupled thereto for interconnection with the first plurality of contacts, wherein the first plurality of terminals is formed on the first surface. A second integrated circuit is formed on the second surface, and electrically isolated from the first integrated circuit, the second integrated circuit having a second plurality of terminals coupled thereto for interconnection with the second plurality of contacts, wherein the second plurality of terminals is formed on the first surface and coupled to the second integrated circuit via plated holes formed through the integrated circuit die, wherein the second plurality of terminals is electrically isolated from the first plurality of terminals and the first integrated circuit.

In accordance with a third aspect of the present invention, an electronic device comprises a circuit carrying substrate having first and second pluralities of contacts formed thereon, circuitry for processing electrical signals mounted on the circuit carrying substrate, the circuitry including at least one integrated circuit chip. The integrated circuit chip comprises an integrated circuit die having first and second opposing surfaces. A first integrated circuit is formed on the first surface, the first integrated circuit having a first plurality of terminals coupled thereto for interconnection with the first plurality of contacts, wherein the first plurality of terminals is formed on the first surface. A second integrated circuit is formed on the second surface, and electrically isolated from the first integrated circuit, the second integrated circuit having a second plurality of terminals coupled thereto for interconnection with the second plurality of contacts, wherein the second plurality of terminals is formed on the first surface and coupled to the second integrated circuit via plated holes formed through the integrated circuit die, wherein the second plurality of terminals is electrically isolated from the first plurality of terminals and the first integrated circuit.

BRIEF DESCRIPTION OF THE DRAWINGS

FIGS. 8 and 9 are illustrations of integrated circuit chips in accordance with further alternate embodiments of the present invention.

DESCRIPTION OF A PREFERRED EMBODIMENT

Figure 1:
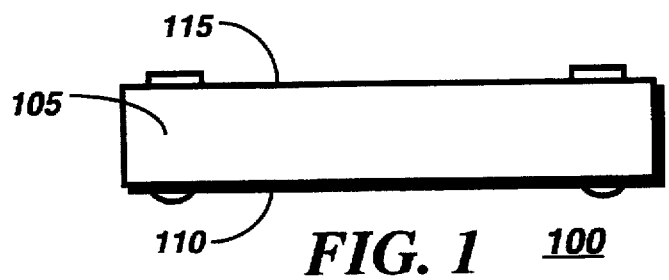
FIG. 1 is a side view of an integrated circuit chip in accordance with a preferred embodiment of the present invention.

FIG. 1 depicts an integrated circuit chip 100 in accordance with a preferred embodiment of the present invention. The integrated circuit chip 100 comprises an integrated circuit die 105 having first and second opposing surfaces 110, 115. The integrated circuit chip 100 further comprises first and second integrated circuits formed on the first and second surfaces 110, 115 of the integrated circuit die 105 using techniques similar to conventional wafer processing techniques.

By way of example, if transistors are to be formed on the surface of a wafer which includes the integrated circuit die 105, a layer of silicon dioxide ($SiO_2$) is grown on both surfaces 110, 115, which are typically polished to a mirror finish to eliminate scratches and imperfections. The silicon dioxide layer protects the surface of the wafer from contamination by impurities. Next, photolithographic techniques are employed to remove the oxide, on both surfaces 110, 115, in regions where transistors will ultimately be placed, subsequent to which the wafer is placed in a diffusion furnace in which a gas containing an n-type impurity is passed over the surfaces 110, 115 of the wafer. When the gas decomposes, the impurity atoms are deposited on the wafer, thereby forming an n-type highly conductive layer, i.e., a buried layer, on each surface 110, 115 of the wafer.

Thereafter, epitaxial layers comprising silicon atoms are grown on the surfaces 110, 115 of the wafer by exposing the wafer at high temperature to an atmosphere containing a silicon compound. Isolation walls and base and emitter impurity distributions are put in place during successive oxide growths, photolithography steps, and diffusions in a manner well known to one of ordinary skill in the art. Next, terminals designed in accordance with conventional flip-chip, wirebonding, and/or tape automated bonding technology are formed and coupled by metallization to the integrated circuit elements formed on the surfaces 110, 115 of the wafer. The wafer is then processed to separate the integrated circuit die 105 from other integrated circuit dies.

As described above, the integrated circuit chip 100, unlike conventional integrated circuit chips, includes integrated circuit elements formed on both surfaces 110, 115 of the integrated circuit die 105. It may be appreciated that the method by which integrated circuit elements are formed on both surfaces 110, 115 comprises essentially the same steps by which integrated circuit elements are formed on conventional integrated circuit chips.

Figure 2:
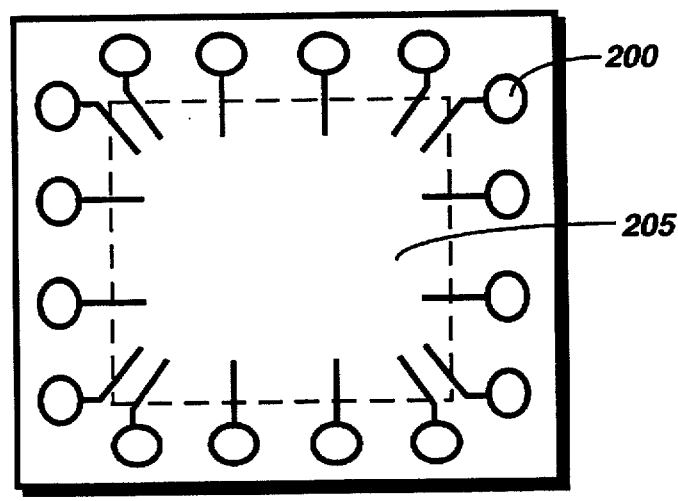
FIG. 2 is a top plan view of the first surface of the integrated circuit chip in accordance with the preferred embodiment of the present invention.

FIG. 2 is a top plan view of the first surface 110 of the integrated circuit chip 100. As shown, a first plurality of terminals 200 are formed on the first surface 110 of the integrated circuit die 105 in a manner well known to one of ordinary skill in the art. The first plurality of terminals 200 are utilized to couple a first integrated circuit 205 formed on the first surface 110 to external circuitry. In accordance with the preferred embodiment of the present invention, the first plurality of terminals 200 are designed in accordance with flip-chip interconnect technology and have solder bumps disposed thereon. Preferably, the first plurality of terminals 200 is distributed along the perimeter of the integrated circuit die 105 such that the area available for formation of the first integrated circuit 205 is maximized.

Figure 3:
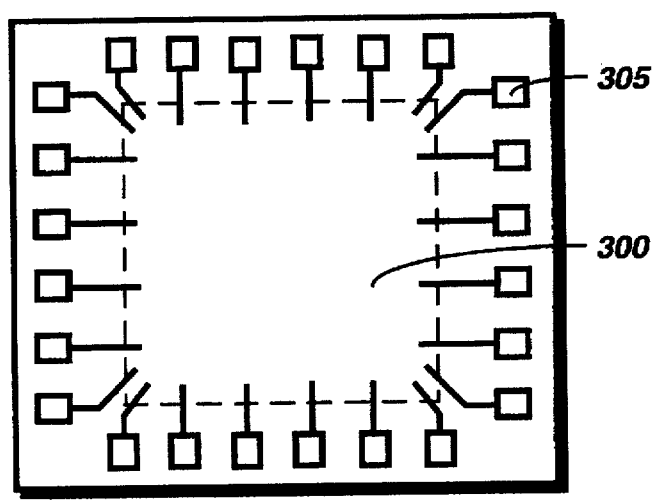
FIG. 3 is a top plan view of the second surface of the integrated circuit chip in accordance with the preferred embodiment of the present invention.

FIG. 3 is a top plan view of the second surface 115 of the integrated circuit chip 100. According to the present invention, a second integrated circuit 300 is formed, using conventional wafer processing techniques, on the second surface 115 of the integrated circuit die 105. The second integrated circuit 300 is connected to a second plurality of terminals 305 for electrically coupling the second integrated circuit 300 to external circuitry. Preferably, the second plurality of terminals 305 is designed utilizing conventional wirebonding interconnect technology or tape automated bonding technology and is distributed, similar to the first plurality of terminals 200 (FIG. 2), along the perimeter of the integrated circuit die 105.

Figure 4:
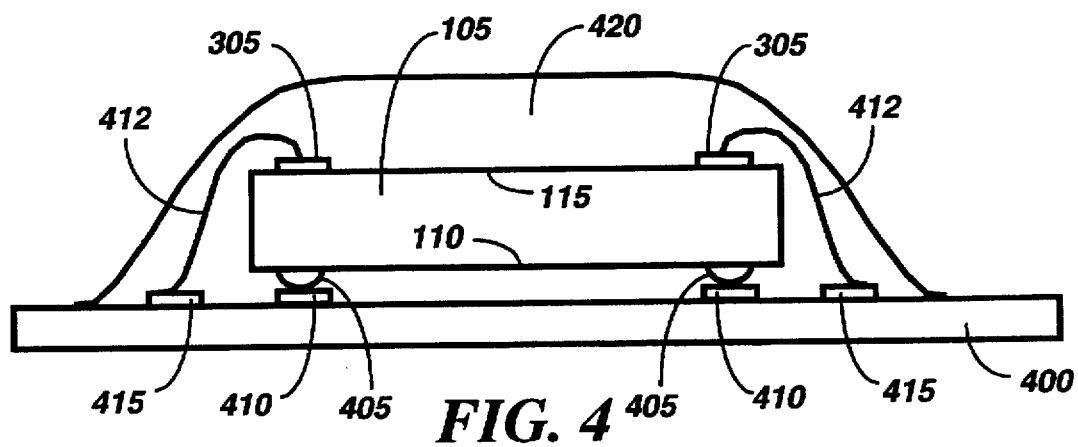
FIG. 4 is a side view of the integrated circuit chip mounted on a circuit carrying substrate in accordance with the preferred embodiment of the present invention.

Referring next to FIG. 4, a side view of the integrated circuit chip 100 (FIG. 1) mounted on a circuit carrying substrate 400, such as a printed circuit board, is shown. Preferably, the integrated circuit die 105 is placed on the circuit carrying substrate 400 such that the first surface 110 is facing the circuit carrying substrate 400, i.e., adjacent to the circuit carrying substrate 400. In this position, the solder bumps 405 disposed on the first plurality of terminals 200 (FIG. 2) contact a first plurality of electrical contacts 410 formed on the circuit carrying substrate 400. The solder bumps 405 can bond the first plurality of terminals 200 to the first plurality of contacts 410 in a number of well known bonding processes, such as reflow, thermosonic, or pressure contact bonding methods.

In accordance with the preferred embodiment of the present invention, the second plurality of terminals 305 is electrically coupled to a second plurality of electrical contacts 415 formed on the circuit carrying substrate 400 utilizing conventional interconnect technology, such as wirebonding or tape automated bonding. Using wirebonding technology, a single wire 412 is electrically connected, such as during a soldering process, between each of the second plurality of terminals 305 and each of the second plurality of contacts 415. In tape automated bonding, metallized polyimide fingers (not shown) interconnect the second plurality of terminals 305 and the second plurality of contacts 415. Thereafter, the integrated circuit chip 100 is encapsulated by an encapsulation layer 420 formed from a protective material such as silicone, epoxy, or ceramic. The primary purpose of the encapsulation layer 420 is to protect the integrated circuit chip 100 from mechanical and/or environmental stress, e.g., vibration or humidity.

In this manner, the integrated circuit chip 100 utilizes the available space within an electronic device more efficiently than conventional integrated circuit packages. In conventional integrated circuit packages, integrated circuitry is formed on only a single side of the wafer, and therefore on only a single side of the integrated circuit die. As a result, a relatively small amount of integrated circuitry can be formed on the single surface of the integrated circuit die. To solve this problem, some typical integrated circuit packages comprise a stacked arrangement of integrated circuit chips. Although an integrated circuit package utilizing stacked integrated circuit chips more efficiently utilizes the area of a substrate to which it is mounted, extra space is necessary to accommodate the additional height of such a package. Conversely, the integrated circuit chip 100 according to the present invention includes additional integrated circuitry, i.e., the first and second integrated circuits 205, 300, without increasing the height of the device. Therefore, the integrated circuit chip 100 is especially advantageous for use in more streamlined electronic devices, such as credit-card type data communication receivers.

Figure 5:
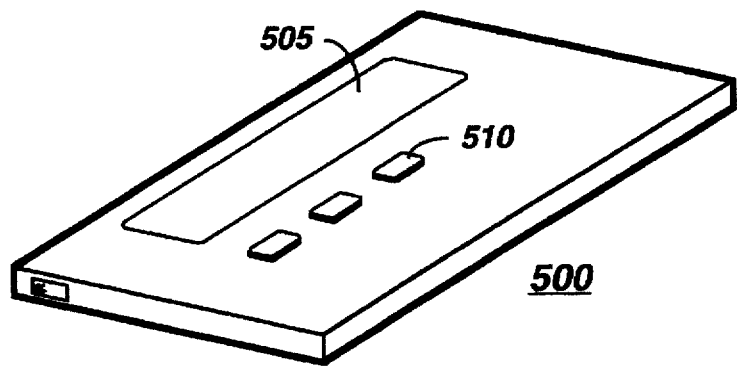
FIG. 5 is a perspective view of a conventional data communication receiver.
Figure 6:
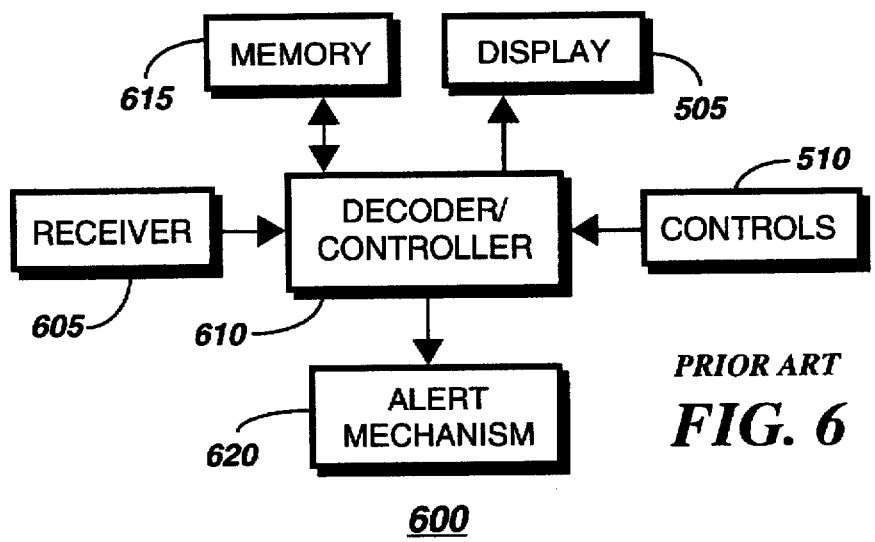
FIG. 6 is an electrical block diagram of receiver circuitry included within the conventional data communication receiver of FIG. 5.

FIG. 5 is a perspective view of a credit-card type data communication receiver 500. Such a device is typically very attractive to a user because of its relatively thin size. A difficulty in manufacturing the credit-card type data communication receiver 500, however, arises because a large amount of circuitry must be included within the receiver 500 to provide features, such as a display 505 and controls 510, desired by the user. As shown in FIG. 6, data communication receiving circuitry 600 typically included in the data communication receiver 500 (FIG. 5) includes a receiver 605 for receiving and demodulating a selective call message. The selective call message is thereafter provided to a decoder/controller 610 for recovery of message information from the selective call message. Typically, the message information is stored in a memory 615 coupled to the decoder/controller 610 and an alert is generated by an alert mechanism 620, such as a transducer, to announce reception of the selective call message to the user. The message information is subsequently displayed on the display 505 either automatically or in response to user manipulation of the controls 510 (FIG. 5).

It may be appreciated by one of ordinary skill in the art that the circuitry 600 consumes a large amount of space within the thin, credit-card type data communication receiver 500. As a result, the integrated circuit chip 100 according to the present invention would be especially advantageous for use in an electronic device such as the data communication receiver 500 wherein the available space is extremely limited.

Figure 7:
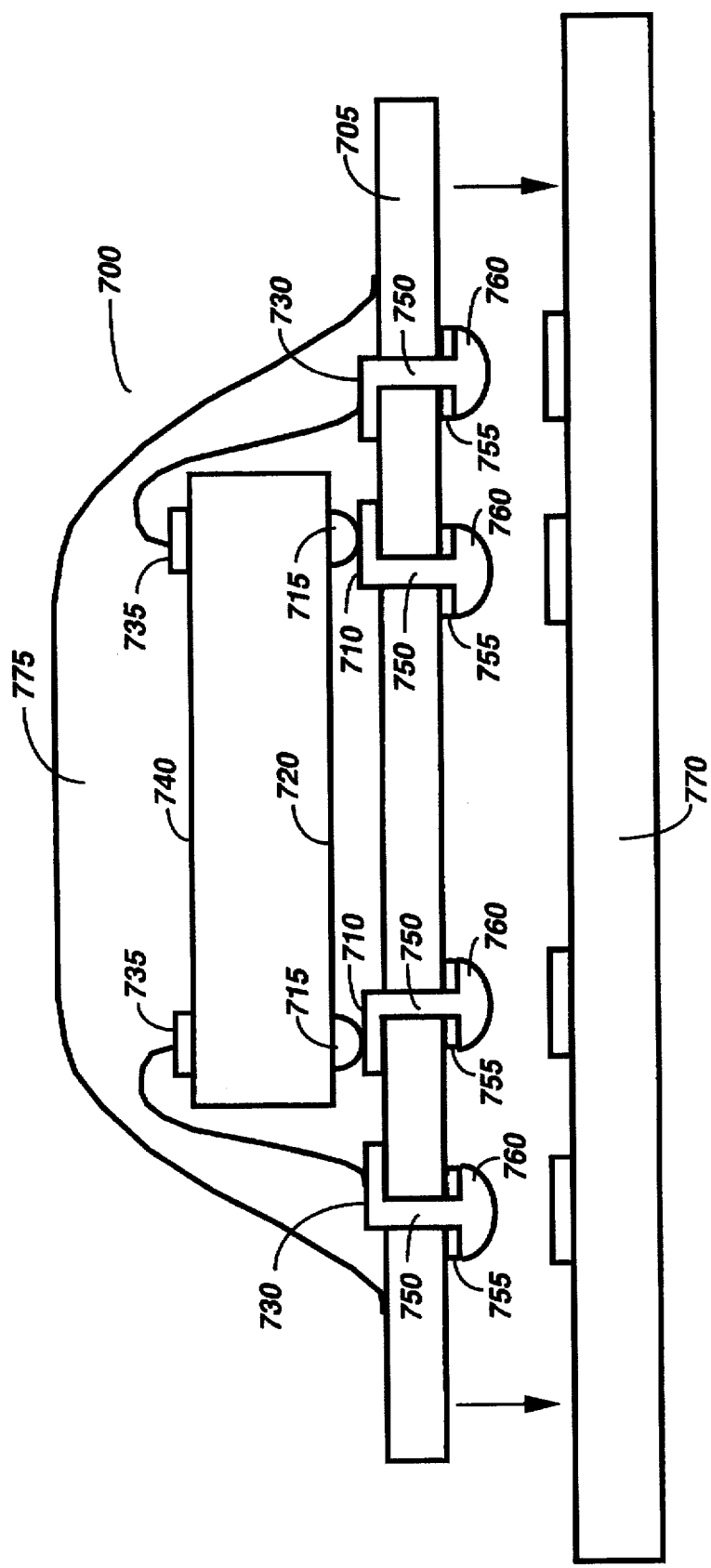
FIG. 7 is an illustration of an integrated circuit chip in accordance with an alternate embodiment of the present invention.

Referring next to FIG. 7, an integrated circuit chip 700 in accordance with an alternate embodiment of the present invention is depicted. As shown, the integrated circuit chip 700 further includes a smaller circuit carrying substrate, such as a ceramic substrate 705. The ceramic substrate 705 comprises a first plurality of contacts 710 which are coupled to terminals 715 formed on the first surface 720 of the integrated circuit die, preferably utilizing flip-chip interconnect technology. Additionally, a second plurality of contacts 730 are formed on the ceramic substrate 705 for coupling to terminals 735 formed on the second surface 740 of the integrated circuit die. The ceramic substrate 705 includes, according to the alternate embodiment, a plurality of through-holes 750 for interconnecting the first and second pluralities of contacts 710, 730 to conductive pads 755 formed on the bottom surface of the ceramic substrate 705. Solder bumps 760 are preferably disposed on the conductive pads 755 such that the integrated circuit chip 700 can be easily bonded, for example, by reflow, to a primary printed circuit board 770 during the manufacturing process.

It may be appreciated that the integrated circuit chip 700 according to the alternate embodiment requires only a simple one-step process for attachment to the primary printed circuit board 770. As a result, devices utilizing the integrated circuit chip 700 may be simpler to assemble than devices utilizing the integrated circuit chip 100 in accordance with the preferred embodiment of the present invention. Additionally, the ceramic substrate 705, in combination with the encapsulating layer 775, further reduces the stresses to which the integrated circuit die is subjected. However, the integrated circuit chip 700 according to the alternate embodiment is thicker because it includes the ceramic substrate 705, which is not included in the integrated circuit chip 100 according to the preferred embodiment. Therefore, the integrated circuit chip 700 may not be suitable for use in extremely thin devices, such as the credit-card type data communication receiver 500 described above.

FIGS. 8 and 9 illustrate integrated circuit chips in accordance with further embodiments of the present invention. FIG. 8 shows an integrated circuit chip 800 which employs terminals 805, 807 designed according to flip-chip interconnect technology. The integrated circuit chip 800, similar to the integrated circuit chip 100 (FIG. 1), comprises integrated circuits on both surfaces of the integrated circuit die 810.

The integrated circuit formed on the upper surface 815 is coupled to corresponding terminals 805 on the lower surface 820 via plated through-holes 825 drilled through the integrated circuit die 810. The integrated circuit formed on the lower surface 820 is coupled to corresponding terminals 807 by etched metallization, as is well known to one of ordinary skill in the art. The integrated circuit chip 800 according to the alternate embodiment of the present invention further comprises a plurality of solder bumps 830 disposed on the terminals 805, 807. Therefore, the integrated circuit chip 800 can be bonded to a circuit carrying substrate, such as a printed circuit board, by methods such as thermosonic bonding, pressure bonding, or reflow.

FIG. 9 shows an integrated circuit chip 900 which is coupled to a printed circuit board 902 by wirebonding or tape automated bonding. In accordance with this alternate embodiment, integrated circuitry formed on the upper surface 905 is coupled to terminals 910 also formed on the upper surface 905. Integrated circuitry formed on the lower surface 912 is coupled to terminals 915 formed on the upper surface 905 by plated through-holes 920. When the integrated circuit chip 900 is positioned on the printed circuit board 902, the terminals 910, 915 are wirebonded, as shown, or tape automated bonded to corresponding contacts 925 on the printed circuit board 902.

The alternate embodiments depicted in FIGS. 8 and 9 have the advantage that the integrated circuit chips 800, 900 need only a single bonding process, i.e., wirebonding, tape automated bonding, or flip-chip, to be attached to a printed circuit board. Therefore, the assembly process of a device utilizing one of the integrated circuit chips 800, 900 may be simpler than that for a device utilizing the integrated circuit chip 100 (FIG. 1), which requires two different bonding processes. However, because, in FIGS. 8 and 9, the terminals for the integrated circuitry are all located on a single surface of the integrated circuit die, a greater surface area is required to accommodate the same amount of integrated circuitry. As a result, the integrated circuit chips 800, 900 may not be suitable for use in some smaller devices in which space constraints are critical.

It may be appreciated by one of ordinary skill in the art that the integrated circuit chips 800, 900 may, similar to the integrated circuit chip 700 (FIG. 7), include smaller circuit carrying substrates to further simplify the manufacturing process and to reduce stress on the integrated circuit dies. However, this would increase the sizes of the integrated circuit chips 800, 900 even more and therefore might be undesirable.

In summary, the integrated circuit chip according to the present invention includes integrated circuits formed on both upper and lower surfaces of the integrated circuit die. As a result, the integrated circuit chip in accordance with the preferred embodiment includes a greater amount of integrated circuitry than included in conventional integrated circuit chips.

In conventional integrated circuit chips, integrated circuitry is formed on only a single surface of the integrated circuit die. Therefore, because a smaller amount of circuitry is formed on the integrated circuit chip, more than one conventional integrated circuit chip must often be utilized in an electronic device, such as a pager. However, space constraints within a pager are often critical, leaving little or no room for additional integrated circuit chips. To solve this problem, integrated circuit packages have been formed in which integrated circuit chips are stacked to decrease the area consumed within the pager. Although this approach is feasible in thicker pagers, smaller pagers, such as credit-card type pagers, are often too thin to accommodate the greater height of these stacked integrated circuit packages. Therefore, the integrated circuit chip according to the present invention, which is no greater in height than conventional integrated circuit chips, is especially advantageous for use in such smaller devices.

It may be appreciated by now that there has been provided an integrated circuit chip which more efficiently utilizes the space available within an electronic device.

What is claimed is:

1. An integrated circuit chip, comprising:
   an integrated circuit die having first and second opposing surfaces;
   a first integrated circuit formed on the first surface, the first integrated circuit having a first plurality of terminals coupled thereto for connection to first circuitry external to the integrated circuit chip, wherein the first plurality of terminals is formed on the first surface; and
   a second integrated circuit formed on the second surface, the second integrated circuit electrically isolated from the first integrated circuit, the second integrated circuit having a second plurality of terminals coupled thereto for connection to second circuitry external to the integrated circuit chip, wherein the second plurality of terminals is formed on the first surface and coupled to the second integrated circuit via plated holes formed through the integrated circuit die, wherein the second plurality of terminals is electrically isolated from the first plurality of terminals and the first integrated circuit.

2. An electronic assembly, comprising:
   a circuit carrying substrate having first and second pluralities of contacts formed thereon; and
   an integrated circuit chip mounted on the circuit carrying substrate, the integrated circuit chip comprising:
      an integrated circuit die having first and second opposing surfaces;
      a first integrated circuit formed on the first surface, the first integrated circuit having a first plurality of terminals coupled thereto for interconnection with the first plurality of contacts, wherein the first plurality of terminals is formed on the first surface; and
      a second integrated circuit formed on the second surface, the second integrated circuit electrically isolated from the first integrated circuit, the second integrated circuit having a second plurality of terminals coupled thereto for interconnection with the second plurality of contacts, wherein the second plurality of terminals is formed on the first surface and coupled to the second integrated circuit via plated holes formed through the integrated circuit die, wherein the second plurality of terminals is electrically isolated from the first plurality of terminals and the first integrated circuit.

3. The electronic assembly according to claim 2, wherein the first and second pluralities of terminals are coupled to the first and second pluralities of contacts utilizing flip-chip interconnect technology.

4. The electronic assembly according to claim 2, wherein:
   the integrated circuit chip is mounted on the circuit carrying substrate such that second surface of the integrated circuit die is adjacent to the circuit carrying substrate; and
   a plurality of interconnects electrically couples the first and second pluralities of terminals to the first and second pluralities of contacts.

5. The electronic assembly according to claim 4 wherein the first and second pluralities of terminals are coupled to the first and second pluralities of contacts utilizing wirebonding interconnect technology.

6. An electronic device, comprising:

a circuit carrying substrate having first and second pluralities of contacts formed thereon;

circuitry for processing electrical signals mounted on the circuit carrying substrate, the circuitry including at least one integrated circuit chip comprising:

an integrated circuit die having first and second opposing surfaces;

a first integrated circuit formed on the first surface, the first integrated circuit having a first plurality of terminals coupled thereto for interconnection with the first plurality of contacts, wherein the first plurality of terminals is formed on the first surface; and a second integrated circuit formed on the second surface, the second integrated circuit electrically isolated from the first integrated circuit, the second integrated circuit having a second plurality of terminals coupled thereto for interconnection with the second plurality of contacts, wherein the second plurality of terminals is formed on the first surface and coupled to the second integrated circuit via plated holes formed through the integrated circuit die, wherein the second plurality of terminals is electrically isolated from the first plurality of terminals and the first integrated circuit.

7. The electronic device according to claim 6, wherein the circuitry comprises receiving circuitry for receiving and processing a radio frequency signal to recover therefrom a selective call message.

8. The electronic device according to claim 6, wherein:

the integrated circuit chip is mounted on the circuit carrying substrate such that second surface of the integrated circuit die is adjacent to the circuit carrying substrate; and a plurality of interconnects electrically couples the first and second pluralities of terminals to the first and second pluralities of contacts.

9. The electronic device according to claim 8, wherein the first and second pluralities of terminals are coupled to the first and second pluralities of contacts utilizing wirebonding interconnect technology.

* * * * *